US007649237B2

(12) United States Patent
Chen

(10) Patent No.: US 7,649,237 B2

(45) Date of Patent: Jan. 19, 2010

(54) SCHOTTKY DIODE FOR HIGH SPEED AND RADIO FREQUENCY APPLICATION

(75) Inventor: Shou-Mao Chen, Hsin-Chuang (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/121,207

(22) Filed: May 15, 2008

(65) Prior Publication Data

US 2009/0283851 A1 Nov. 19, 2009

(51) Int. Cl.
*H01L 29/47* (2006.01)

(52) U.S. Cl. ............................... 257/471; 257/E21.047

(58) Field of Classification Search ............ 257/475.54, 257/73, 155, 449, 453, 454, 471, 473, 478, 257/107, 109, E51.009, E33.051, E31.065, 257/E31.074, E27.04, E21.047
See application file for complete search history.

(56) References Cited

U.S. PATENT DOCUMENTS 6,121,122 A 9/2000 Dunn et al.
2003/0137320 A1* 7/2003 Grundl et al. .................. 326/1
2005/0201173 A1* 9/2005 Sharma et al. .............. 365/218
2005/0269658 A1* 12/2005 Ku et al. ..................... 257/471
2006/0118854 A1* 6/2006 Lee ............................ 257/315
2006/0125040 A1* 6/2006 Levin et al. ................. 257/471
2006/0246670 A1* 11/2006 Khemka et al. ............. 438/285

OTHER PUBLICATIONS

S. Sankaran et al., "Schottky Barrier Diodes for . . . ", 2005, IEEE Electron Devices Letters, vol. 26, No. 7, pp. 492-494.*

* cited by examiner

*Primary Examiner*—Thomas L Dickey
*Assistant Examiner*—Nikolay Yushin
(74) *Attorney, Agent, or Firm*—Haynes and Boone, LLP

(57) ABSTRACT

A semiconductor diode that eliminates leakage current and reduces parasitic resistance is disclosed. The semiconductor diode comprises a semiconductor substrate; a semiconductor layer disposed on the semiconductor substrate, wherein the semiconductor layer includes a first dopant and a first well with a Schottky region; and a polysilicon device positioned above the semiconductor layer and adjacent to the first well with the Schottky region.

21 Claims, 5 Drawing Sheets

SCHOTTKY DIODE FOR HIGH SPEED AND RADIO FREQUENCY APPLICATION

BACKGROUND

Integrated circuit (IC) technologies are constantly being improved. Such improvements frequently involve scaling down device geometries to achieve lower fabrication costs, higher device integration density, higher speeds, and better performance. Along with the advantages from geometry size reductions, improvements to IC devices are being made. One such IC device is a Schottky barrier diode. The Schottky barrier diode comprises a metal in contact with the surface of a semiconductor material. Schottky barrier diodes exhibit very low forward voltage drop, switching speeds that approach zero time, and are particularly useful in radio-frequency applications. However, conventional Schottky barrier diodes exhibit higher than desirable leakage current and parasitic resistance.

Accordingly, what is needed is a semiconductor device that eliminates current leakage and reduces parasitic resistance.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
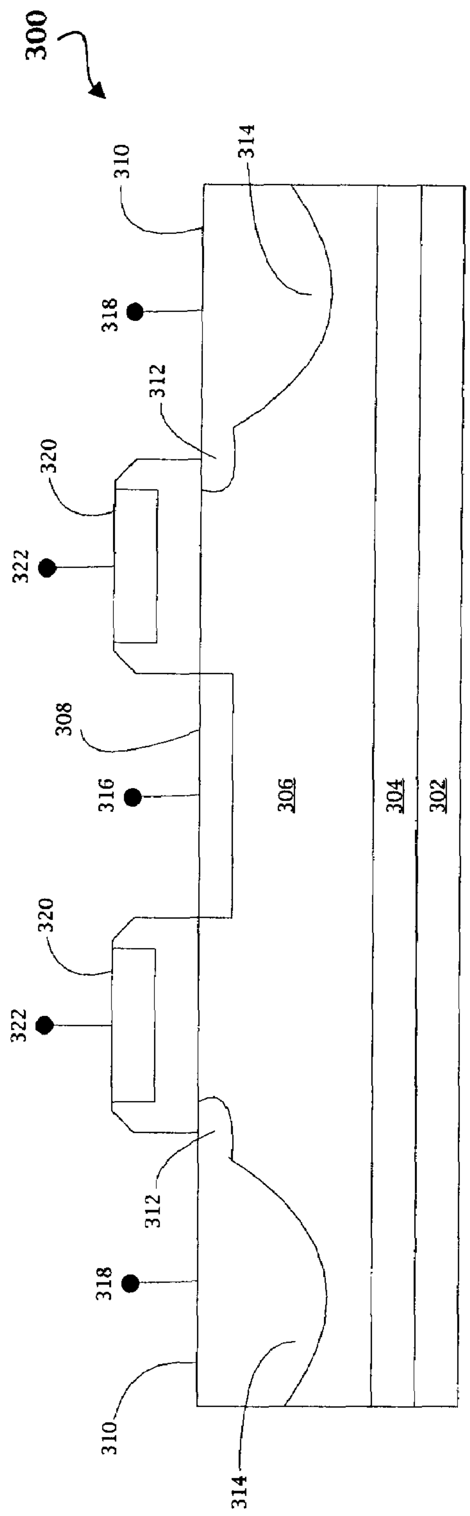
FIG. 1 is a cross-section of a semiconductor diode that eliminates current leakage and reduces parasitic resistance according to one embodiment of the present invention.

The present disclosure relates generally to the field of integrated circuits, and more particularly, to a semiconductor diode that eliminates leakage current and reduces parasitic resistance.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

With reference to FIGS. 1 through 7, a semiconductor diode 300 and a semiconductor diode 400 for eliminating leakage current and reducing parasitic resistance are collectively described below. It is understood that additional features can be added in the semiconductor diodes 300 and 400, and some of the features described below can be replaced or eliminated, for additional embodiments of the semiconductor diodes. The present embodiment of semiconductor diodes 300 and 400 significantly reduces leakage current and parasitic resistance.

Figure 2:
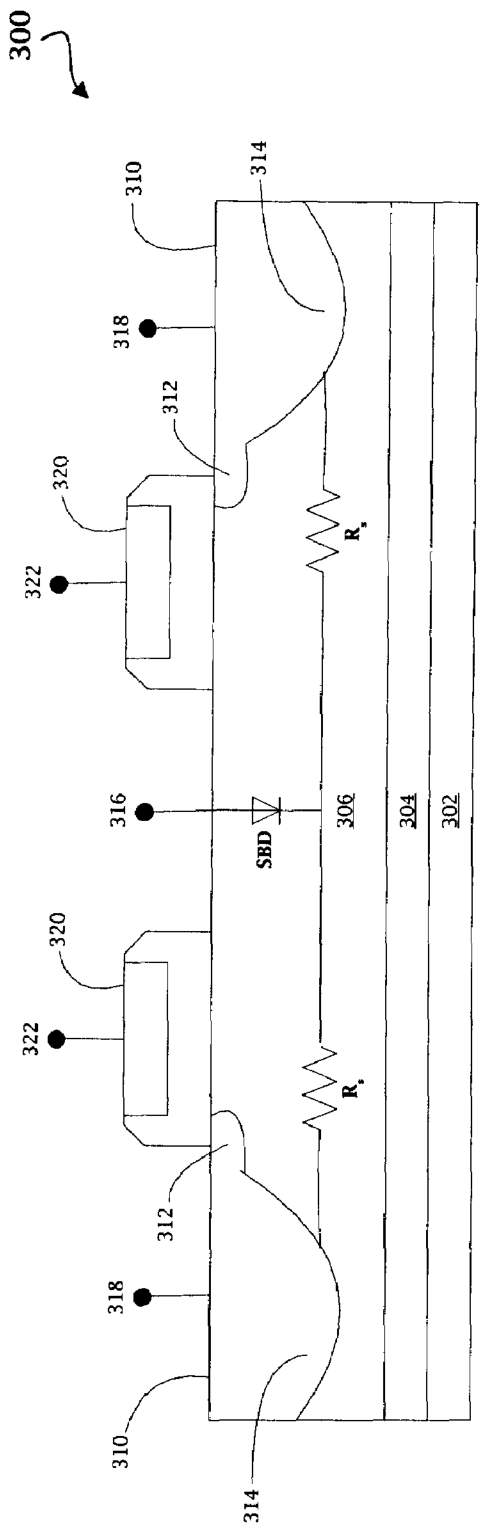
FIG. 2 is a schematic of a semiconductor diode that reduces leakage current and parasitic resistance according to one embodiment of the present invention.

Referring to FIGS. 1 and 2, the semiconductor diode 300 comprises a semiconductor substrate 302, a first semiconductor layer 304, a second semiconductor layer 306, a first well 308, a second well 310 including a first portion 312 and a second portion 314, a first node 316, at least one second node 318, a polysilicon device 320, and at least one third node 322. FIG. 2 provides a schematic/circuit diagram of the semiconductor device 300. The first well 308 is represented by a Schottky Barrier Diode ("SBD"). The resistors, $R_s$, represent the parasitic resistance arising from the SBD.

The semiconductor substrate 302 may comprise an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; or an alloy semiconductor including SiGe, GaAsP, AlInAs, AlGaAs, GaInAs, GaInP, and GaInAsP; or any other suitable material; or combinations thereof. In one embodiment, the alloy semiconductor substrate may have a gradient SiGe feature in which the Si and Ge composition change from one ratio at one location to another ratio at another location of the gradient SiGe feature. In another embodiment, the alloy SiGe is formed over a silicon substrate. In another embodiment, a SiGe substrate is strained. Furthermore, the semiconductor substrate may be a semiconductor on insulator, such as a silicon on insulator (SOI), or a thin film transistor (TFT). In some examples, the semiconductor substrate may include a doped epi layer or a buried layer. In other examples, the compound semiconductor substrate may have a multilayer structure, or the substrate may include a multilayer compound semiconductor structure.

The semiconductor substrate 302 is doped, either heavily or lightly, with p-type or n-type dopants. For example, the semiconductor substrate 302 may be doped with p-type dopants, such as boron or $BF_2$. Alternatively, the semiconductor substrate 302 may be doped with n-type dopants, such as phosphorus or arsenic. In the present embodiment, the semiconductor substrate 302 is doped with a p-type dopant.

The semiconductor layers 304, 306 are doped, either heavily or lightly, with p-type or n-type dopants. The semiconductor layers 304, 306 may comprise various doping profiles and/or conductivity types and may be doped with similar or different conductivity types. The first semiconductor layer 304 and second semiconductor layer 306 may be formed by any suitable process, such as epitaxy growth, ion implantation, any other suitable process, and/or combinations thereof. In the present embodiment, the first semiconductor layer 304 is a doped deep n-type (DNW) layer, and the second semiconductor layer 306 is a doped n-type layer. Alternatively, the semiconductor layers 304, 306 may be doped p-type, with the first semiconductor layer 304 being doped deep p-type and the second semiconductor layer 306 being doped p-type. It is understood that any combination of doping profiles and/or conductivity types in the semiconductor substrate 302, first semiconductor layer 304, and second semiconductor layer 306 may exist.

The second semiconductor layer 306 further comprises the first well 308 and the second well 310 including the first portion 312 and the second portion 314. The first well 308 and second well 310 are doped regions that may comprise various doping profiles and/or conductivity types and may be doped with similar or different conductivity types as one another, second semiconductor layer 306, first semiconductor layer 304, and/or semiconductor substrate 302.

The first well 308 comprises a Schottky region. In standard complementary metal-oxide semiconductor (CMOS) processes, the Schottky region is typically formed with a standard voltage threshold (SVT) dopant, such as a silicide film on an N-well surface. In the present embodiment, to form a better Schottky barrier junction, the Schottky region is formed by implanting a light n-type dopant. The light n-type dopant replaces the typical SVT dopant. The light n-type dopant comprises a n-type, low voltage threshold (LVT) dopant and/or a n-type, non-voltage threshold (non-VT) dopant. In alternate embodiments, the Schottky region may comprise a light p-type dose; a p-type LVT dopant; a p-type non-VT dopant; a high voltage threshold dopant, p-type or n-type; a standard voltage threshold dopant, p-type or n-type; any other suitable dopant; and/or combinations thereof. Further, it is understood that the Schottky region may be formed by any suitable process. In alternate embodiments, the semiconductor diode 300 may comprise multiple first wells 308.

The second well 310 includes the first portion 312 and the second portion 314. In the present embodiment, the semiconductor diode 300 comprises two second wells 310. In alternate embodiments, the semiconductor diode 300 may comprise only one second well 310 or multiple second wells 310. The first portion 312 and the second portion 314, doped heavily or lightly, and n-type or p-type, are formed in the semiconductor layer 306. In alternate embodiments, the portions 312, 314 may be formed directly on the semiconductor layer 306, in a P-well structure, in a N-well structure, in a dual-well structure, or using a raised structure. The portions 312, 314 are formed by any suitable process, such as ion implantation and/or a rapid thermal process (RTP) to activate the doped regions. The portions 312, 314 may comprise various doping profiles and may be formed by a plurality of ion implantation processes, such as lightly doped drain (LDD) implant processes and source/drain (S/D) implant processes. In the present embodiment, the first portion 312 is a lightly doped drain, the second portion 314 is a heavily doped drain, and both portions 312, 314 are doped with an n-type dopant. Alternate embodiments may have only the first portion 312 or the second portion 314.

The first well 308 and second well 310 are further coupled to nodes. The first node 316 is coupled to the first well 308, and each second well 310 is coupled to the second nodes 318. The semiconductor diode 300 may comprise multiple first nodes and second nodes. The first node 316 and the second nodes 318 may further comprise a high-potential terminal, a low-potential terminal, a floating terminal, or a terminal at some additional voltage bias. In the present embodiment, the first node 316 includes a high-potential terminal, and the second nodes 320 include low-potential terminals.

The conventional Schottky barrier diode ("SBD") has a shallow trench isolation (STI) disposed on each side of the Schottky region, which suffers high leakage current around the STI edge region and higher than desirable parasitic resistance. In semiconductor diode 300, the polysilicon device 320 replaces the STI in the conventional SBD. The polysilicon device 320 is positioned between the first well 308 and the second well 310. In the present embodiment, the semiconductor diode 300 comprises two polysilicon devices 320, positioned between each second well 310 and each side of the first well 308. It is understood that in alternate embodiments the semiconductor diode 300 may comprise only one polysilicon device 320 or multiple polysilicon devices 320. Replacing the STI with the polysilicon device 320 creates a direct path through the semiconductor layer 306 between the first node 316 and the second node 318, without an intervening non-conductive region.

The polysilicon device 320 may include one or many different layers. The polysilicon device may be composed of a dielectric and an electrode. The dielectric may be a suitable dielectric material or may have a multilayer structure comprising multiple dielectric materials. The dielectric material may have relatively high integrity and low current leakage. Examples of the dielectric material include silicon oxide, silicon nitride, silicon oxynitride, and any other high-k dielectric material. The high k dielectric may include hafnium oxide, zirconium oxide, aluminum oxide, a hafnium dioxide-alumina ($HfO_2$—$Al_2O_3$) alloy, or combinations thereof. In other embodiments, the dielectric may be doped polycrystalline silicon with the same or different doping. The electrode may comprise polycrystalline silicon; silicon-containing materials; germanium-containing materials; metal, such as aluminum, copper, tungsten, titanium, tantulum, titanium nitride, tantalum nitride, nickel silicide, cobalt silicide; other proper conductive materials; and combinations thereof. Further, the electrode and dielectric may comprise conductive materials and may have a multilayer structure. The conductive material may comprise polycrystalline silicon, poly-SiGe, metal, metal silicide, metal nitride, metal oxide, or combinations thereof. The polysilicon device 320 may further comprise spacers. The spacers may comprise a dielectric material such as silicon nitride, silicon oxide, silicon carbide, silicon oxynitride, other suitable materials, and/or combinations thereof.

The polysilicon device 320 is further coupled to the third node 322, which may be a high-potential terminal, a low-potential terminal, a floating terminal, or a terminal at some additional voltage bias. In the present embodiment, the third node 322 includes either a floating terminal or a terminal at some voltage bias. By varying the voltage bias of the third terminal 322, the parasitic resistance may be controlled.

Figure 3:
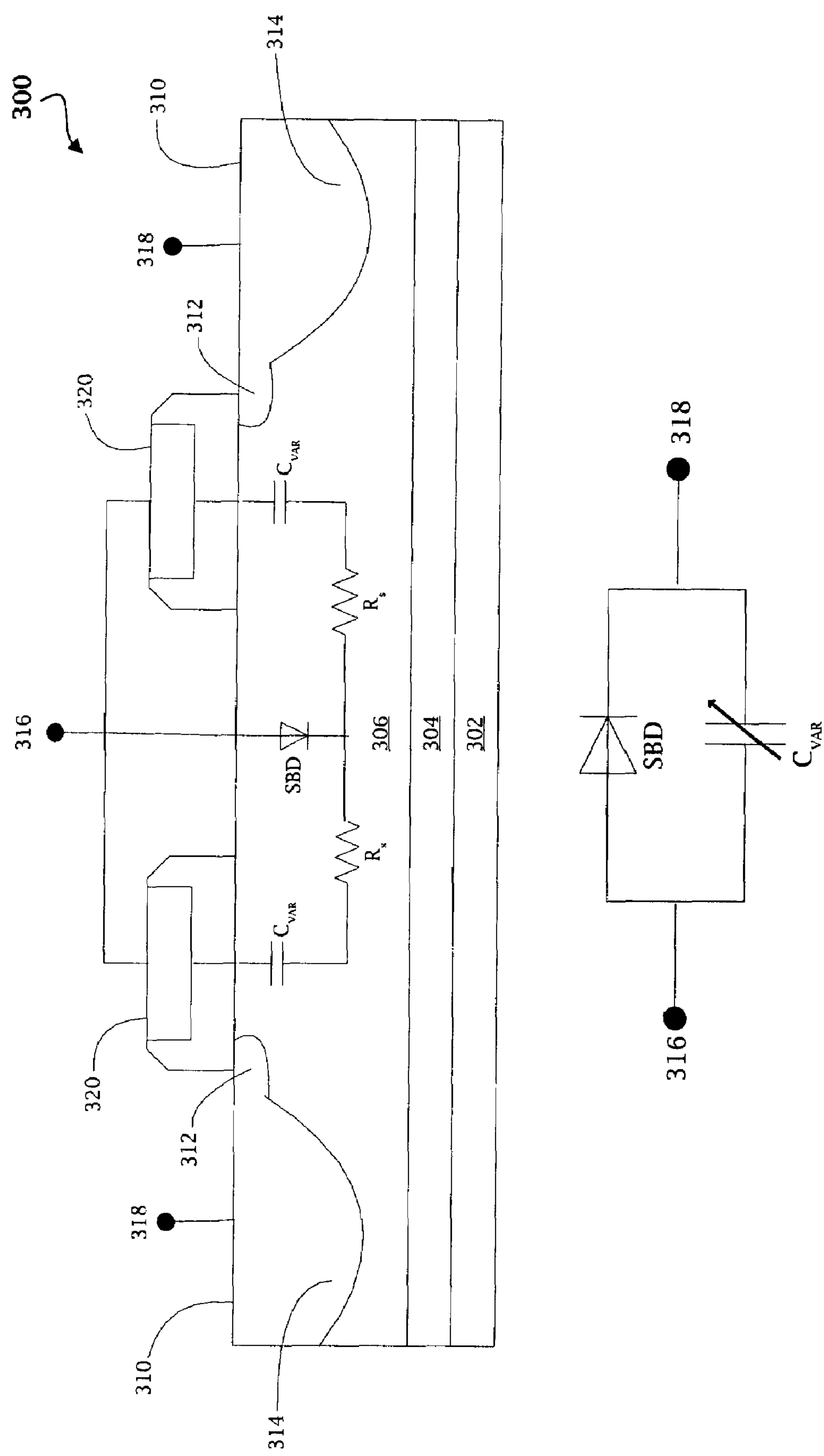
FIG. 3 is a schematic/circuit diagram of a semiconductor diode that functions as a varactor according to one embodiment of the present invention.
Figure 4:
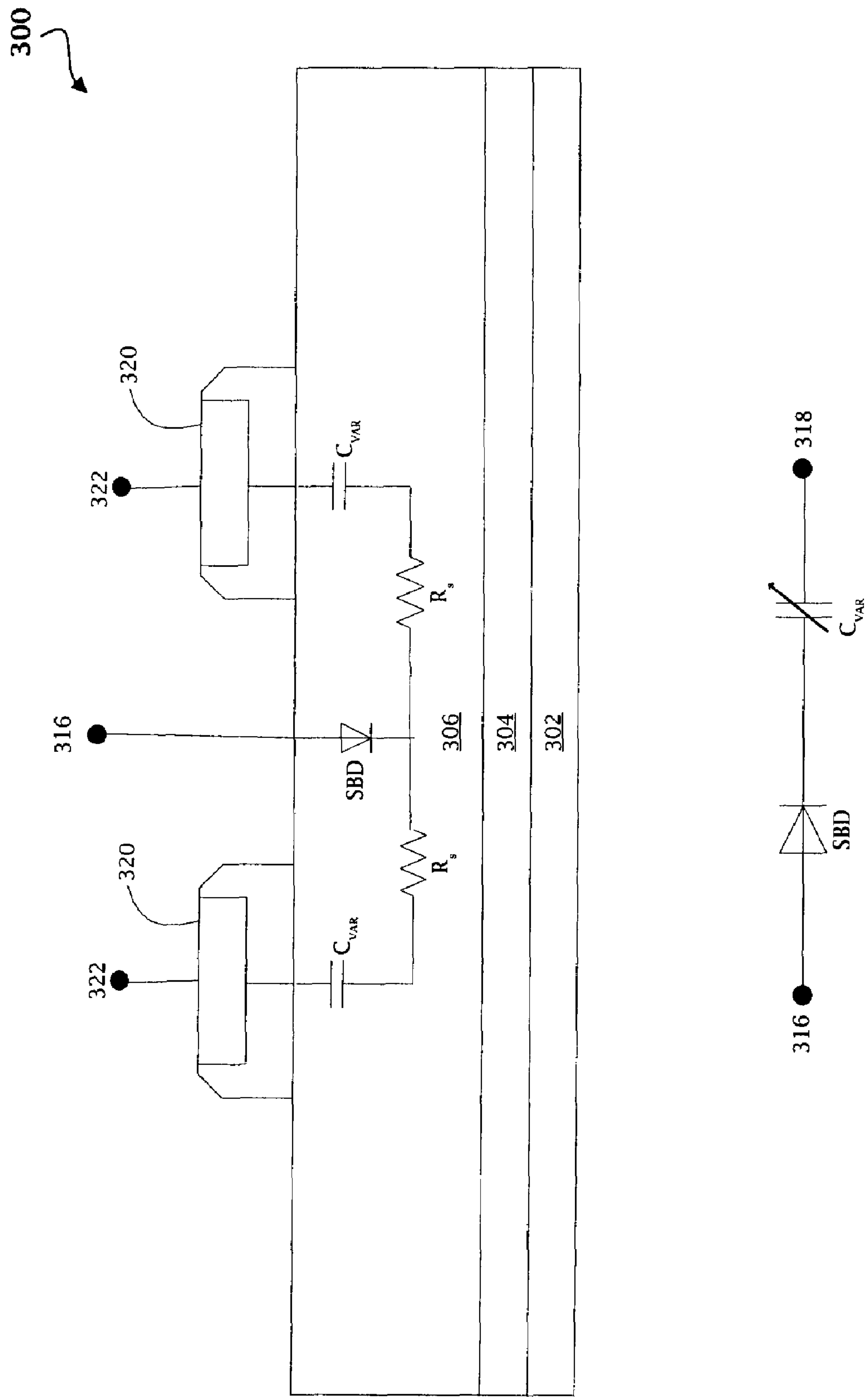
FIG. 4 is a schematic/circuit diagram of a semiconductor diode that functions as a varactor according to one embodiment of the present invention.

Referring to FIGS. 3 and 4, the polysilicon device 320 of semiconductor diode 300 can function as a varactor. FIG. 3 provides a schematic/circuit diagram of the polysilicon device 320 functioning as a varactor according to one embodiment of the present invention. The Schottky Barrier Diode ("SBD"), representing the first well 308, is coupled to the first node 316, which includes a high-potential terminal. The second wells 310 are coupled to the second nodes 318, which include low-potential terminals. The polysilicon devices 320 are electrically connected to the first node 316 (the high-potential terminal). This effectively connects the SBD in parallel with the polysilicon devices 320, allowing the capacitance of the SBD to vary with voltage changes. The variable capacitance of the SBD is represented by a capacitor, $C_{VAR}$, and the resistors, Rs, represent the parasitic resistance. FIG. 4 also provides a schematic/circuit diagram of the polysilicon device 320 functioning as a varactor according to one embodiment of the present invention. The SBD is coupled to the first node 316, which includes a high-potential terminal. The polysilicon devices 320 are coupled to the third nodes 322, which include low-potential terminals, electrically isolating the second wells 310/second nodes 318 of semiconductor device 300 from the polysilicon devices 320. This effectively connects the SBD in series with the polysilicon devices 320, allowing the capacitance of the SBD, represented by the capacitor ($C_{VAR}$), to vary with voltage changes.

Figure 5:
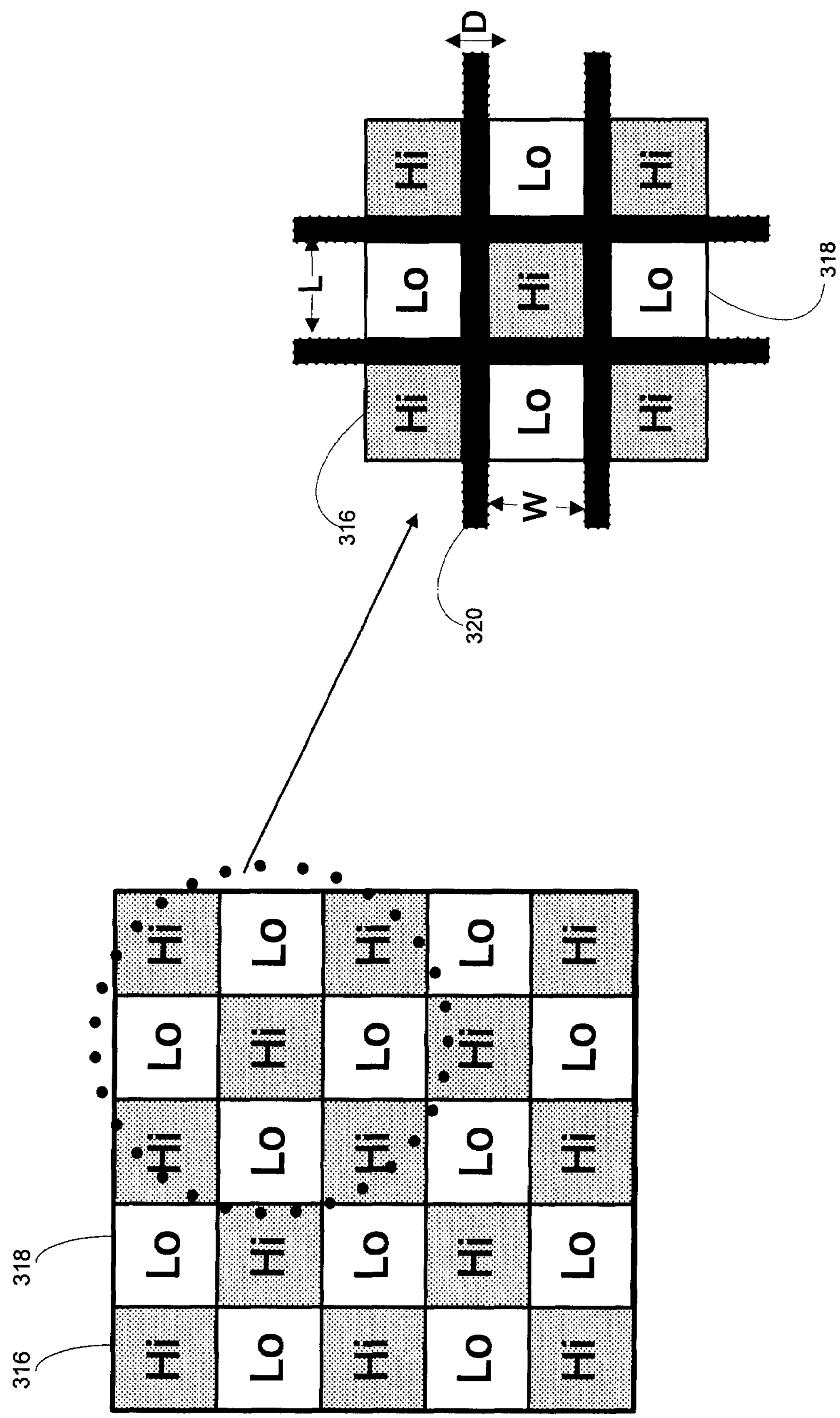
FIG. 5 is a top view of a semiconductor diode array that eliminates current leakage and reduces parasitic resistance according to one embodiment of the present invention.

FIG. 5 provides a top view of multiple semiconductor diodes 300 arranged closely together to form a semiconductor diode array. In the present embodiment, the first nodes 316 include high terminals, and the second nodes 318 include low terminals. Several semiconductor diodes 300 with high and low terminals are arranged so that polysilicon devices 320 are disposed between the high and low terminals (i.e., disposed between the first well 308 and the second well 310). The portion represented by the dotted circle is a portion of the semiconductor diode array. The portion includes five semiconductor diodes arranged closely together. D represents the width of the polysilicon devices 320, and L and W represent the length/width between each polysilicon device 320. The semiconductor diode array of FIG. 5 provides an optimized arrangement, which minimizes parasitic resistance and the device area, for high speed and radio frequency circuit applications.

Figure 6:
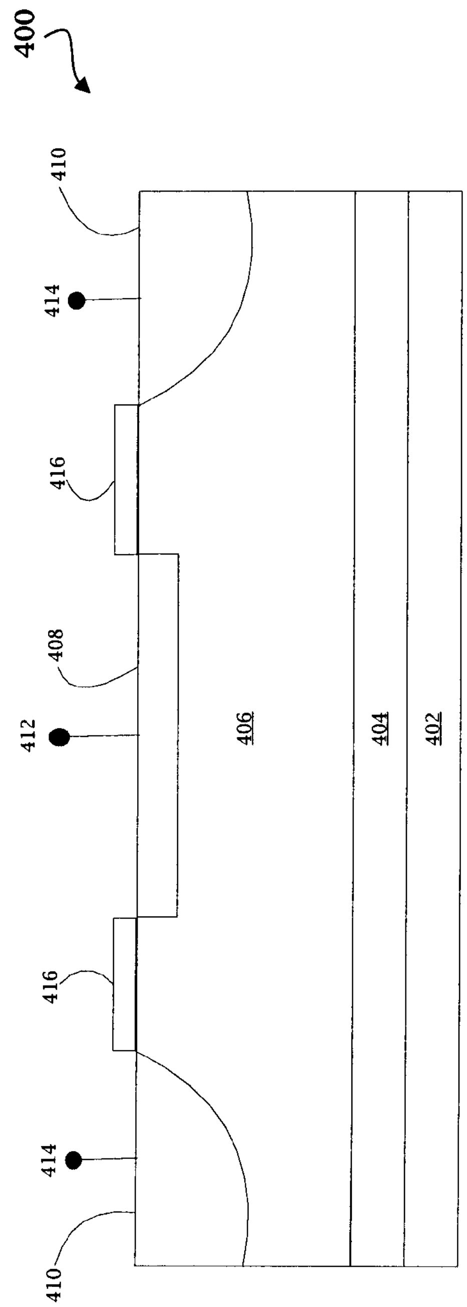
FIG. 6 is a cross-section of a semiconductor diode that eliminates current leakage and reduces parasitic resistance according to one embodiment of the present invention.
Figure 7:
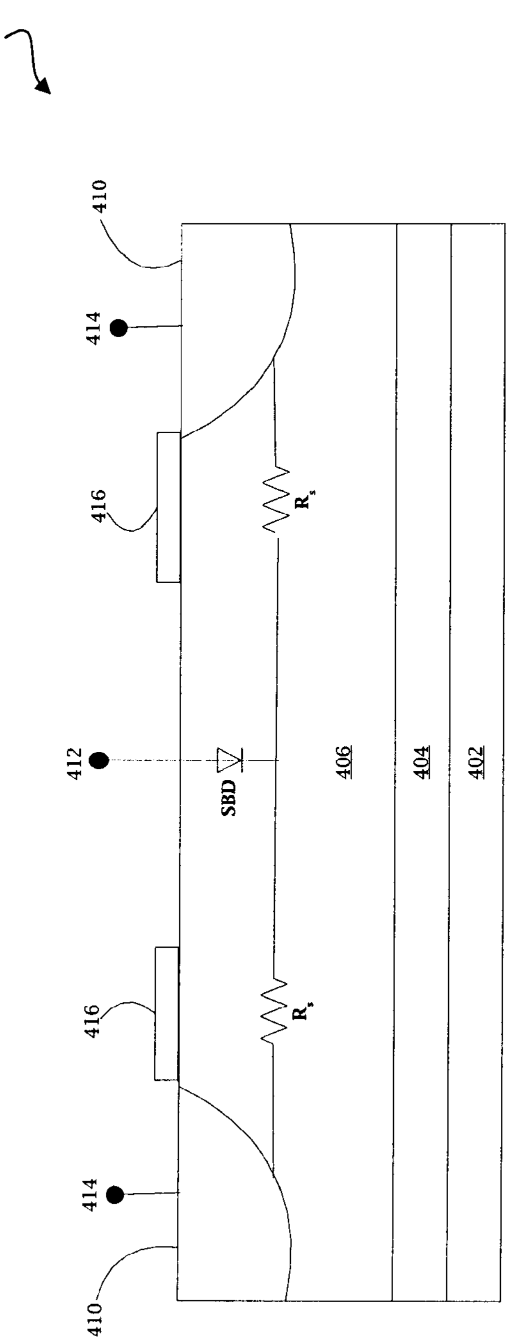
FIG. 7 is a schematic of a semiconductor diode that eliminates current leakage and reduces parasitic resistance according to one embodiment of the present invention.

Referring to FIGS. 6 and 7, the semiconductor diode 400 comprises a semiconductor substrate 402, a first semiconductor layer 404, a second semiconductor layer 406, a first well 408, a second well 410, a first node 412, a second node 414, and a resist protection oxide region 416. FIG. 7 provides a schematic/circuit diagram of the semiconductor device 400. The first well 408 is represented by a Schottky Barrier Diode ("SBD"). The resistors, $R_s$, represent the parasitic resistance arising from the SBD.

The semiconductor substrate 402 may comprise an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; or an alloy semiconductor including SiGe, GaAsP, AlInAs, AlGaAs, GaInAs, GaInP, and GaInAsP; or any other suitable material; or combinations thereof. In one embodiment, the alloy semiconductor substrate may have a gradient SiGe feature in which the Si and Ge composition change from one ratio at one location to another ratio at another location of the gradient SiGe feature. In another embodiment, the alloy SiGe is formed over a silicon substrate. In another embodiment, a SiGe substrate is strained. Furthermore, the semiconductor substrate may be a semiconductor on insulator, such as a silicon on insulator (SOI), or a thin film transistor (TFT). In some examples, the semiconductor substrate may include a doped epi layer or a buried layer. In other examples, the compound semiconductor substrate may have a multilayer structure, or the silicon substrate may include a multilayer compound semiconductor structure.

The semiconductor substrate 402 is doped, either heavily or lightly, with p-type or n-type dopants. For example, the semiconductor substrate 402 may be doped with p-type dopants, such as boron or $BF_2$. Alternatively, the semiconductor substrate 402 may be doped with n-type dopants, such as phosphorus or arsenic. In the present embodiment, the semiconductor substrate 402 is doped with a p-type dopant.

The first semiconductor layer 404 is formed on the semiconductor substrate 402, and the second semiconductor layer 406 is formed on the first semiconductor layer 404. The semiconductor layers 404, 406 are doped, either heavily or lightly, with p-type or n-type dopants. The semiconductor layers 404, 406 may comprise various doping profiles and/or conductivity types and may be doped with similar or different conductivity types. The first semiconductor layer 404 and second semiconductor layer 406 may be formed by any suitable process, such as epitaxy growth, ion implantation, any other suitable process, and/or combinations thereof. In the present embodiment, the first semiconductor layer 404 is a doped deep n-type (DNW) layer, and the second semiconductor layer 406 is a doped n-type layer. Alternatively, the semiconductor layers 404, 406 may be doped p-type, with the first semiconductor layer 404 being doped deep p-type and the second semiconductor layer 406 being doped p-type. It is understood that any combination of doping profiles and/or conductivity types in the semiconductor substrate 402, first semiconductor layer 404, and second semiconductor layer 406 may exist.

The second semiconductor layer 406 further comprises the first well 408 and the second well 410. The first well 408 and second well 410 are doped regions that may comprise various doping profiles and/or conductivity types and may be doped with similar or different conductivity types as one another, second semiconductor layer 406, first semiconductor layer 404, and/or semiconductor substrate 402.

The first well 408 comprises a Schottky region. In standard complementary metal-oxide semiconductor (CMOS) processes, the Schottky region is typically formed by standard voltage threshold (SVT) dopant, such as a silicide film on an N-well surface. In the present embodiment, to form a better Schottky barrier junction, the Schottky region is formed by implanting a light n-type dopant. The light n-type dopant replaces the typical SVT dopant. The light n-type dopant comprise a n-type, low voltage threshold (LVT) dopant and/or a n-type, non-voltage threshold (non-VT) dopant. In alternate embodiments, the Schottky region may comprise a light p-type dose; a p-type LVT dopant; a p-type non-VT dopant; a high voltage threshold dopant, p-type or n-type; a standard voltage threshold dopant, p-type or n-type; any other suitable dopant; and/or combinations thereof. Further, it is understood that the Schottky region may be formed by any suitable process. In alternate embodiments, the semiconductor diode 400 may comprise multiple first wells 408.

The semiconductor device 400 comprises two second wells 410. In alternate embodiments, the semiconductor diode 400 may comprise only one second well 410 or multiple second wells 410. The second well 410, doped heavily or lightly and n-type or p-type, is formed in semiconductor layer 406. In alternate embodiments, the second well 410 may be formed directly on the semiconductor layer 406, in a P-well structure, in a N-well structure, in a dual-well structure, or using a raised structure. The second well 410 is formed by any suitable process, such as ion implantation and/or a rapid thermal process (RTP) to activate the doped regions. The second well 410 may comprise various doping profiles and may be formed by a plurality of ion implantation processes, such as lightly doped drain (LDD) implant processes and source/drain (S/D) implant processes. In the present embodiment, the second well 410 is doped with an n-type dopant.

The first well 408 and second well 410 are further coupled to the first node 412 and the second node 414. The first node 412 is coupled to the first well 408, and each second well 410 is coupled to the second nodes 414. The first node 412 and second nodes 414 may comprise a high-potential terminal, a low-potential terminal, a floating terminal, or a terminal at some additional voltage bias. The semiconductor diode 400 may comprise multiple first nodes and second nodes. In the present embodiment, the first node includes a high-potential terminal, and the second node includes a low-potential terminal.

As discussed above, the prior art disposes a shallow trench isolation (STI) on either side of the Schottky region, which suffers high leakage current around the STI edge region and higher than desirable parasitic resistance. In the present embodiment, the resist protection oxide (RPO) 416 replaces the STI in the prior art. The RPO 416 is disposed between the first well 408 and the second well 410 (i.e., between the first node and the second node). The RPO 416 may be a dielectric layer, such as an oxide layer, a nitride layer, an oxy-nitride layer, other suitable layers, and/or combinations thereof. The RPO 416 may also include one or many different layers. In the present embodiment, the RPO 416 is an oxide layer. In the present embodiment, the semiconductor diode 400 comprises two RPOs 416, one positioned adjacent to each side of the first well 408. It is understood that in alternate embodiments the semiconductor diode 400 may comprise only one RPO 416 or multiple RPOs 416. Replacing the STI in the conventional Schottky barrier diode with the RPO 416 effectively produces no leakage current and reduces the parasitic resistance.

Overall, the disclosed embodiments provide one or more of the following advantages: (1) implanting the Schottky region with a light dopant forms a better Schottky barrier junction; (2) replacing the shallow trench isolation (STI) with the polysilicon device or resist protection oxide eliminates leakage current and reduces parasitic resistance; (4) biasing the polysilicon device can reduce the parasitic resistance; (5) the polysilicon device functions as a varactor device; (6) the proposed semiconductor diode reduces device area by reducing the length/width between each polysilicon device; and (7) the proposed semiconductor diode effectively eliminates current leakage and reduces parasitic resistance.

In summary, a semiconductor diode is provided that effectively improves the Schottky barrier junction, eliminates current leakage, and reduces parasitic resistance.

In one embodiment, a semiconductor diode comprises a semiconductor substrate; a semiconductor layer disposed on the semiconductor substrate, wherein the semiconductor layer includes a first dopant and a first well with a Schottky region; and a polysilicon device positioned above the semiconductor layer and adjacent to the first well with the Schottky region.

In some embodiments, the semiconductor diode further comprises a first node coupled to the first well with the Schottky region; the semiconductor layer having a second well with a second dopant, the second dopant being of a common conductivity type as the first dopant; a second node coupled to the second well; and a third node coupled to the polysilicon device. In some embodiments, the polysilicon device is positioned between the first well and the second well.

In some embodiments, the first well with the Schottky region is of a common conductivity type as the first dopant and the second dopant. In some embodiments, the conductivity type for the first dopant, second dopant, and first well with the Schottky region is n-type. In some embodiments, there is a direct path through the semiconductor layer between the connection with the first node and the connection with the second node, without an intervening non-conductive region. In some embodiments, the first well with the Schottky region includes a light n-type low threshold voltage (LVT) dopant or a light n-type non-voltage threshold (non-VT) dopant. In some embodiments, the second well includes a lightly doped drain (LDD) portion. In some embodiments, the first node includes a high-potential terminal, the second node includes a low-potential terminal, and the third node includes either a floating terminal or a voltage-biased terminal.

In some embodiments, the polysilicon device is electrically connected to the first well with the Schottky region in parallel, the third node coupled to the polysilicon device being electrically connected to the first node coupled to the first well. In some embodiments, the polysilicon device is electrically connected to the first well with the Schottky region in series, the third node being coupled to the polysilicon device, the first node being coupled to the first well, and the second node being electrically isolated from the polysilicon device. In some embodiments, the third node includes a low-potential terminal, and the first node includes a high-potential terminal.

In one embodiment, a semiconductor diode comprises a semiconductor substrate; a semiconductor layer disposed on the semiconductor substrate, wherein the semiconductor layer includes a first dopant and a first well with a Schottky region; and a resist protection oxide region positioned above the semiconductor layer and adjacent to the first well with the Schottky region.

In some embodiments, the semiconductor diode further comprises a first node coupled to the first well with a Schottky region; the semiconductor layer having a second well with a second dopant, the second dopant being of a common conductivity type as the first dopant; and a second node coupled to the second well. In some embodiments, the resist protection oxide region is positioned between the first well and the second well. In some embodiments, the first well with the Schottky region is of a common conductivity type as the first dopant and the second dopant. In some embodiments, the conductivity type for the first dopant, second dopant, and first well with the Schottky region is n-type. In some embodiments, there is a direct path through the semiconductor layer between the connection with the first node and the connection with the second node, without an intervening non-conductive region. In some embodiments, the first well with the Schottky region includes a light n-type low threshold voltage (LVT) dopant or a light n-type non-voltage threshold (non-VT) dopant.

In one embodiment, a semiconductor diode array comprises a plurality of semiconductor diodes, wherein the semiconductor diodes includes a semiconductor substrate; a semiconductor layer disposed on the semiconductor substrate, the semiconductor layer including a first dopant, a first well with a Schottky region, and a second well with a second dopant, wherein a first node is coupled to the first well with the Schottky region and a second node is coupled to the second well; and a polysilicon device positioned between the first well and the second well, wherein a third node is coupled to the polysilicon device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor diode comprising:

a semiconductor substrate;

a semiconductor layer disposed on the semiconductor substrate, wherein the semiconductor layer includes a first dopant and a first well with a Schottky region; and a polysilicon device positioned above the semiconductor layer and adjacent to the first well with the Schottky region.

2. The semiconductor diode of claim 1 further comprising:

a first node coupled to the first well with the Schottky region;

the semiconductor layer having a second well with a second dopant, the second dopant being of a common conductivity type as the first dopant;

a second node coupled to the second well; and a third node coupled to the polysilicon device.

3. The semiconductor diode of claim 2 wherein the polysilicon device is positioned between the first well and the second well.

4. The semiconductor diode of claim 2 wherein the first well with the Schottky region is of a common conductivity type as the first dopant and the second dopant.

5. The semiconductor diode of claim 2 wherein the conductivity type for the first dopant, second dopant, and first well with the Schottky region is n-type.

6. The semiconductor diode of claim 2 wherein there is a direct path through the semiconductor layer between the connection with the first node and the connection with the second node, without an intervening non-conductive region.

7. The semiconductor diode of claim 1 wherein the first well with the Schottky region includes a light n-type low threshold voltage (LVT) dopant or a light n-type non-voltage threshold (non-VT) dopant.

8. The semiconductor diode of claim 2 wherein the second well includes a lightly doped drain (LDD) portion.

9. The semiconductor diode of claim 2 wherein the first node includes a high-potential terminal, the second node includes a low-potential terminal, and the third node includes either a floating terminal or a voltage-biased terminal.

10. The semiconductor diode of claim 2, wherein the polysilicon device is electrically connected to the first well with the Schottky region in parallel, the third node coupled to the polysilicon device being electrically connected to the first node coupled to the first well.

11. The semiconductor diode of claim 2, wherein the polysilicon device is electrically connected to the first well with the Schottky region in series, the third node being coupled to the polysilicon device, the first node being coupled to the first well, and the second node being electrically isolated from the polysilicon device.

12. The semiconductor diode of claim 11, wherein the third node includes a low-potential terminal, and the first node includes a high-potential terminal.

13. A semiconductor diode comprising:

a semiconductor substrate;

a semiconductor layer disposed on the semiconductor substrate, wherein the semiconductor layer includes a first dopant and a first well with a Schottky region; and an isolation region replacement element positioned above the semiconductor layer and adjacent to the first well with the Schottky region.

14. The semiconductor diode of claim 13, wherein the isolation region replacement element positioned above the semiconductor layer and adjacent to the first well with the Schottky region comprises a resist protection oxide region.

15. The semiconductor diode of claim 14 further comprising:

a first node coupled to the first well with a Schottky region;

the semiconductor layer having a second well with a second dopant, the second dopant being of a common conductivity type as the first dopant; and a second node coupled to the second well.

16. The semiconductor diode of claim 15 wherein the resist protection oxide region is positioned between the first well and the second well.

17. The semiconductor diode of claim 15 wherein the first well with the Schottky region is of a common conductivity type as the first dopant and the second dopant.

18. The semiconductor diode of claim 15 wherein the conductivity type for the first dopant, second dopant, and first well with the Schottky region is n-type.

19. The semiconductor diode of claim 15 wherein there is a direct path through the semiconductor layer between the connection with the first node and the connection with the second node, without an intervening non-conductive region.

20. The semiconductor diode of claim 14 wherein the first well with the Schottky region includes a light n-type low threshold voltage (LVT) dopant or a light n-type non-voltage threshold (non-VT) dopant.

21. A semiconductor diode array comprising a plurality of semiconductor diodes, wherein the semiconductor diodes include:

a semiconductor substrate;

a semiconductor layer disposed on the semiconductor substrate, the semiconductor layer including a first dopant, a first well with a Schottky region, and a second well with a second dopant, wherein a first node is coupled to the first well with the Schottky region and a second node is coupled to the second well; and a polysilicon device positioned between the first well and the second well, wherein a third node is coupled to the polysilicon device.

* * * * *